United States Patent [19]

Mao

[11] Patent Number: 5,045,723
[45] Date of Patent: Sep. 3, 1991

[54] MULTIPLE INPUT CMOS LOGIC CIRCUITS

[75] Inventor: Robert S. Mao, San Jose, Calif.

[73] Assignee: International Business Machines Corporation, Armonk, N.Y.

[21] Appl. No.: 560,381

[22] Filed: Jul. 31, 1990

[51] Int. Cl.$^5$ ........................................ H03K 19/094
[52] U.S. Cl. .................................. 307/451; 307/449; 307/279
[58] Field of Search ............... 307/451, 443, 448, 449, 307/272.2, 279, 291

[56] References Cited

U.S. PATENT DOCUMENTS

| | | | |
|---|---|---|---|
| 3,983,420 | 9/1976 | Kikuchi | 307/279 |
| 4,123,669 | 10/1978 | Devine et al. | 307/205 |
| 4,275,312 | 6/1981 | Saitou et al. | 307/449 |
| 4,390,987 | 6/1983 | Best | 370/112 |
| 4,641,046 | 2/1987 | Becker et al. | 307/448 |
| 4,654,547 | 3/1987 | Shaver | 307/450 |
| 4,725,743 | 2/1988 | Anderson | 307/449 |
| 4,857,768 | 8/1989 | Griffith et al. | 307/451 |
| 4,899,070 | 2/1990 | Ou et al. | 307/279 |
| 4,972,102 | 11/1990 | Reis et al. | 307/449 |

FOREIGN PATENT DOCUMENTS 1050099 10/1983 U.S.S.R.
1064445 12/1983 U.S.S.R.

OTHER PUBLICATIONS

Abstract for 1050099, Soviet Union, English Translation.
Abstract for 1064445, Soviet Union, English Translation.

Primary Examiner—David Hudspeth
Assistant Examiner—Scott A. Ouellette
Attorney, Agent, or Firm—Baker, Maxham, Jester & Meador

[57] ABSTRACT

A multiple input CMOS logic circuit includes a bistable input section with two nodes. In an inactive state, the input section maintains the nodes at opposite CMOS logic levels. In an active state, the nodes are maintained at substantially equal levels positioned between the two CMOS logic levels. The input circuit includes a set of parallel CMOS transistor pairs, cross connected at the nodes. The CMOS pairs are unbalanced by inequality of transistor gate widths. The imbalance causes the input circuit to assume the inactive state. A plurality of input CMOS transistors are connected in parallel between the nodes and receive input signals at their gates. When any of the input transistors is turned on by a change of input signal state, it conducts between the nodes, causing the input circuit to transition to the active state. An output buffer connected to the nodes translates the node levels to CMOS signal levels.

7 Claims, 2 Drawing Sheets

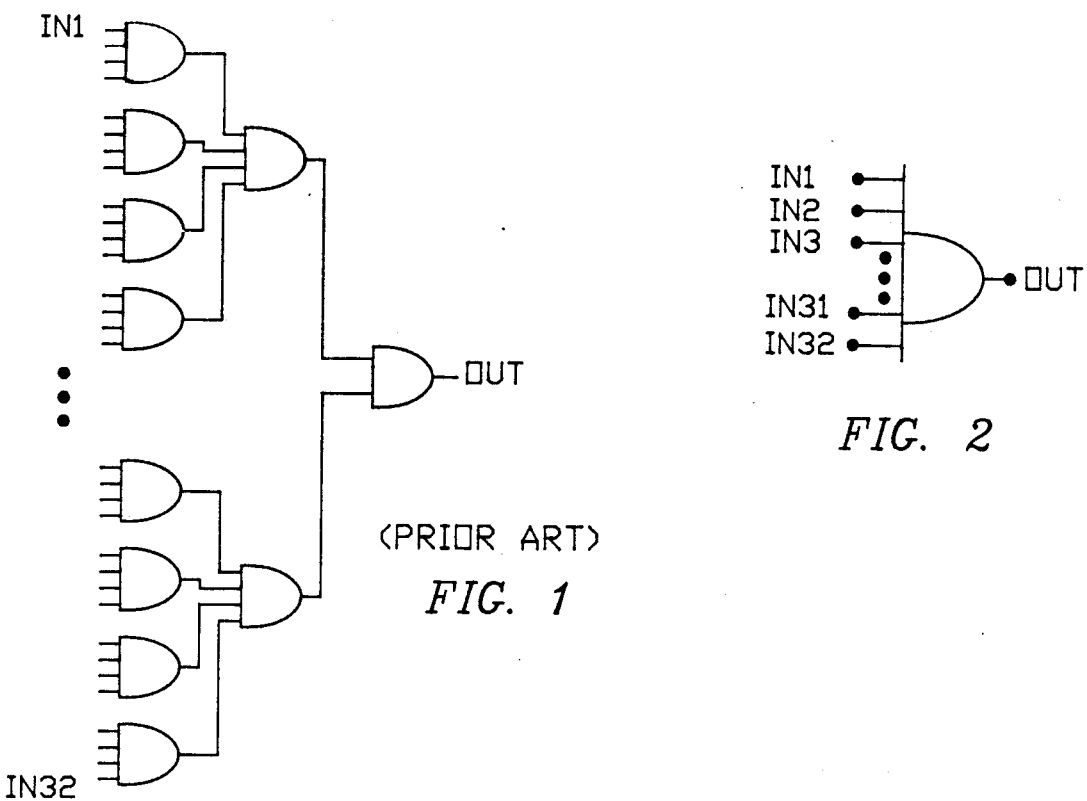

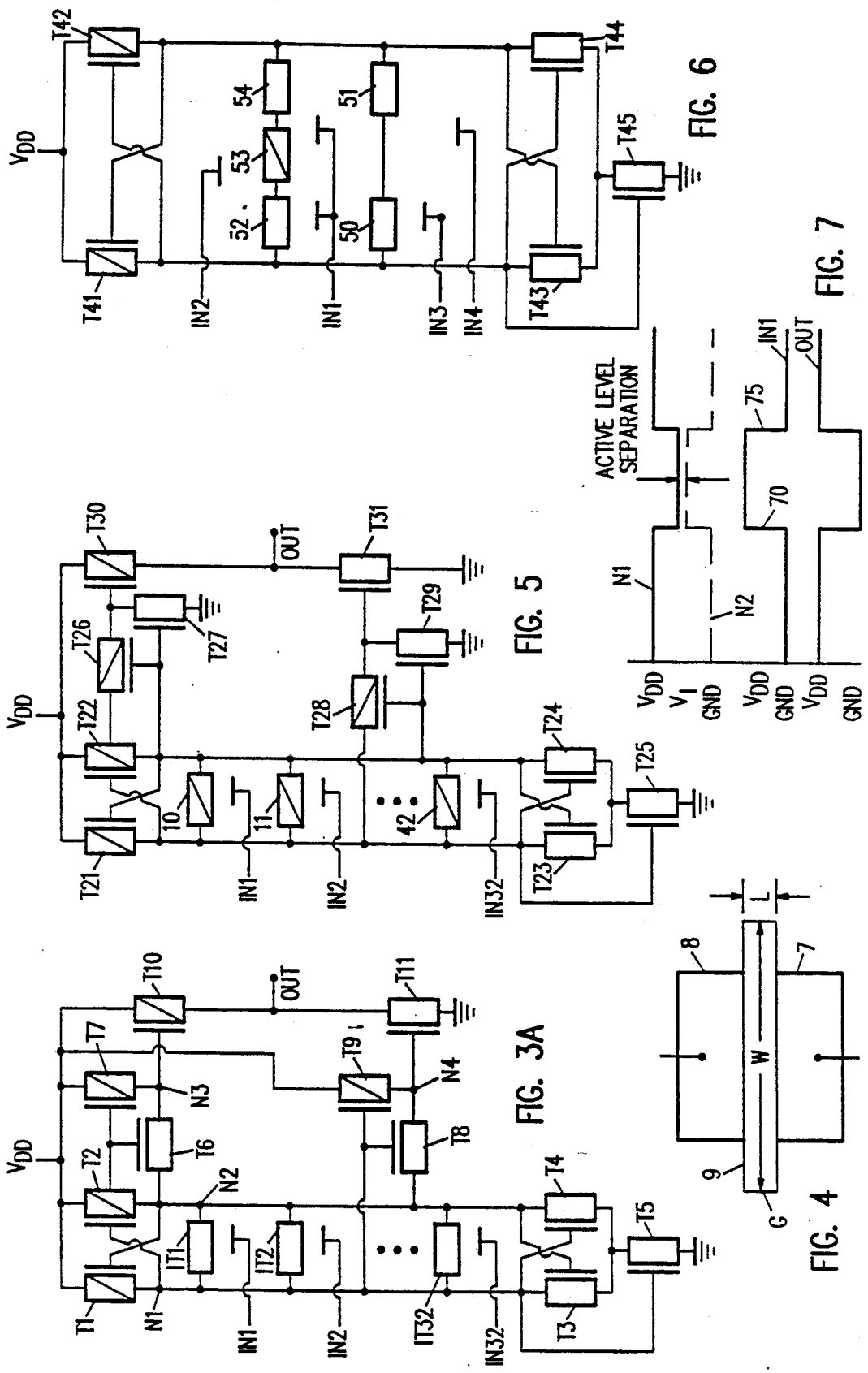

MULTIPLE INPUT CMOS LOGIC CIRCUITS

BACKGROUND OF THE INVENTION

The invention is in the field of logic circuitry, and particularly concerns multiple input CMOS logic circuits.

In CMOS design, multiple input logic circuits are conventionally assembled by cascading basic logic circuits with few inputs. For example, in FIG. 1, a prior art AND gate with 32 inputs is implemented using eleven 4-input AND gates. Conventional CMOS logic circuits are limited to a small number of inputs, typically, 5 or less. More can be added only at the expense of delay of circuit response to a change in input. As a consequence, the total transistor count and actual area occupied by a multiple input CMOS circuit increase almost geometrically with the number of inputs required.

The requirement to use multiple circuit elements with few inputs for implementing CMOS logic results in a technical limit in the design and fabrication of very large scale integrated circuitry (VLSIC). It should be evident that CMOS circuit density would be improved substantially if multiple input CMOS logic could be constructed from a single fundamental configuration. For example, a multiple input CMOS circuit which implemented the 32 input AND gate of FIG. 1 in a single fundamental circuit element would result in the AND gate of FIG. 2. Obviously, the AND gate of FIG. 2 would provide a substantial increase in circuit density over that of FIG. 1 by reducing the sets of switching and interface circuitry required for the basic element from 11 to 1.

SUMMARY OF THE INVENTION

The invention utilizes an unbalanced, bi-stable CMOS input circuit having first and second multi-contact nodes at which are provided substantially unequal signals in response to a first conductivity state existing between the nodes. In response to a second conductivity state, the input circuit provides substantially equal signals at the two multi-contact nodes. A complementary MOS output buffer has a first input connected to the first multi-contact node and a second input connected to the second multi-contact node. The output buffer has an output at which is provided a CMOS logic signal having a first state when the multi-contact node signals are unequal and a second state when the multi-contact node signals are substantially equal. A plurality of input CMOS transistor circuits are connected in parallel across the first and second multi-contact nodes. Each input CMOS transistor circuit has a first current conducting terminal connected to the first node, a second current conducting terminal connected to the second multi-contacting node, and at least one gate terminal for establishing the first or the second conductivity state between the first and second multi-contact nodes in response to the state of one of a plurality of CMOS signals input to the logic circuit of the invention.

Therefore a primary objective of this invention is to provide a multiple input CMOS logic circuit which can receive a plurality of input CMOS signals, execute a logic function, and provide an output CMOS signal representing the logic function output, all with a single set of input and output circuitry.

An advantage which accompanies achievement of this objective is the realization of multiple input CMOS logic functions with a single, fundamental logic device configuration.

These and other objects and advantages of this invention will be appreciated when the following detailed description is read with reference to the below-described drawings.

BRIEF DESCRIPTION OF THE DRAWINGS

FIG. 1 illustrates a prior art CMOS technology structure in which a 32-input AND gate is implemented using eleven 4-input AND gates.

FIG. 2 illustrates a CMOS logic AND gate utilizing the invention to provide a single 32-input AND gate.

FIG. 3A illustrates a 32-input NOR gate according to the invention.

FIG. 3B illustrates the operational states FIG. 3A NOR gate during operation.

FIG. 4 is a top plan representation of a CMOS transistor illustrating channel length and gate width dimensions.

FIG. 5 illustrates a 32-input NAND gate according to the invention.

FIG. 6 illustrates a multiple input combination logic circuit according to the invention.

FIG. 7 includes waveform diagrams illustrating the operation of the circuit of FIG. 3A.

DETAILED DESCRIPTION OF THE PREFERRED EMBODIMENT

When used herein, the term "logic device" refers to a circuit structure which embodies a logic function. Use of the term "circuit device" signifies one of the basic elements of a circuit embodying a logic device. The term "CMOS" technology is well understood, and essentially concerns integrated circuit technology, a basic component of which is a complementary pair of metal-oxide-semiconductor (MOS) transistors. In this description of the invention, the circuit elements include enhancement mode PMOS and NMOS transistors; however, it is asserted that the principles of the invention are also practicable using depletion mode CMOS technology, and other equivalents.

The invention is illustrated, in a NOR gate embodiment, in FIG. 3A. In FIG. 3A, an unbalanced, bistable CMOS input circuit includes PMOS transistors T1 and T2 and NMOS transistors T3, T4, and T5. The drains of transistors T1 and T2 are connected to a drain voltage potential $V_{DD}$, while their sources are connected, respectively, to the drains of NMOS transistors T3 and T4. The sources of the transistors T3 and T4 are connected in common to the drain of transistor T5, whose source is connected to ground. The gates of the PMOS transistors T1 and T2 are cross-connected, each being connected in common with the source of the other transistor. Similarly, the gates of the transistors T3 and T4 are cross-connected to the drains of those transistors, while the gate of the transistor T5 is connected in common to the drain of the transistor T3 with the gate of the transistor T4.

The common connection of the gates of transistors T2, T4, and T5 with the drain of transistor T3 and source of transistor T1 forms a first multi-contact node N1. A second multi-contact node N2 exists at the common connection of the gates of transistor T1 and T3 with the source of transistor T2 and the drain of transistor T4.

The input circuit thus described is unbalanced by selective variation of the gate dimensions of load transistors T1 and T2 and driver transistors T3 and T4. The varied dimension is illustrated in FIG. 4, which is a plan schematic view down onto the top surface of a CMOS transistor. The plan view shows source and drain diffusions 7 and 8 and a gate layer 9 which overlies the source and drain diffusions. As is known, for an enhancement mode MOS transistor, application of a gate voltage at the gate electrode G collects carriers and causes a channel to form underneath the gate 9 in the semiconductor substrate between the source and drain diffusions. The length of the channel is shown as L in FIG. 4, while the width of the gate is denoted by W. The drain to source current which flows in the enhancement mode transistor of FIG. 4 is proportional to the ratio W/L. This is clearly laid out by Millman and Grabel at page 145 of their MICROELECTRONICS, published in 1987.

Referring now to FIGS. 3A and 4, the practice of the invention requires that the input circuit in FIG. 3A be unbalanced by varying the W dimension between transistors T1 and T2 and transistors T3 and T4, while maintaining the equality between the other parameters determinative of drain current. Specifically, the gate width of the transistor T1 is greater than the corresponding dimension of transistor T2, while the width of the gate of the transistor T4 is greater than that of the transistor T3. This imbalance sets up a transitional current flow which draws up the potential at the first node N1, while drawing down the potential at the node N2. In its quiescent or rest state, therefore, the unbalanced bistable input circuit of the FIG. 3A NOR gate exhibits a preferred condition in which the node N1 has a CMOS logic value of "1", while the node N2 has a logic value of "0".

A state change from the quiescent or stable state of the unbalanced input circuit of FIG. 3A occurs when one of a plurality of input NMOS transistors is turned on. Each of the input transistors IT1–IT32 has its drain connected to the first multi-contact node N1 and its source to the second multi-contact node N2. The gate of each of the input transistors is connected to receive as an input a standard CMOS logic signal; in FIG. 3A 32 logic inputs IN1–IN32 are illustrated.

While all of the input signals IN1–IN32 have a logic value of "0", all of the input transistors IT1–IT32 are non-conductive and off. When any one of the input logic signals transitions to a logic value of "1", the gate voltage of the input transistor receiving the signal makes a positive transition, turning the transistor on. When the input transistor is turned on, it conducts, dropping the voltage at node N1, while raising the voltage on node N2 until voltages are substantially equal and stable at a point between ground and the drain potential $V_{DD}$. At this point, the transistor stops conducting.

An output buffer including NMOS transistors T6, T8, and T11 and PMOS transistors T7, T9, and T10, translates the voltage swings at the input nodes N1 and N2 into standard CMOS logic levels at an output node OUT. The OUT node is driven by transistors T10 and T11 which are connected in series complement form, with the OUT node connected in common with the source of transistor T10 and drain of transistor T11. The gate of transistor T10 is connected to a translation node N3, and the gate of transistor T11 to a translation node N4. The nodes N3 and N4 are driven in parallel by the translator circuit of transistors T6, T7, T8, and T9.

The translator circuit consists of an upper section including the transistor T6 having a source connected to the input node N2, a gate connected to the input node N1, and a drain connected to the node N3. The upper section also includes the PMOS transistor T7 having a source connected to the translation node N3, a drain connected to the drain voltage source, and a gate connected, in common with the gate of transistor T6, to the input node N1. The lower section of the translator includes the transistor T8 having a source, gate, and drain, connected, respectively, to input node N2, input node N1, and translation node N4. The lower section also includes the PMOS transistor T9 with source, gate, and drain connected to translation node N4, input node N1, and drain source $V_{DD}$, respectively.

The upper and lower sections of the translator operate in parallel to drive the translation nodes N3 and N4 in such a manner as to provide an output signal at the OUT node by operation of transistors T10 and T11.

The operation of the NOR circuit is summarized in the table of FIG. 3B. In its inactive or quiescent state, the unbalanced input circuit of FIG. 3A is configured such that T1 is on and T2 is off, while T3 is off and T4 is on. This draws up the input node N1 to $V_{DD}$ and draws down the input node N2 to ground. Transistor T5 is also in a non-conducting on state by virtue of the positive potential brought to its gate from input node N1. In the inactive state, the NMOS transistor T6 is turned on by the ground potential at its source and the positive potential at its drain. This drops the translation node N3 toward ground, turning on the transistor T10. Translation node N4 is also placed at ground because the NMOS transistor T8 is in a non-conducting on state. The ground potential at translation node N4 turns off the NMOS transistor T11, thereby drawing up the output node to $V_{DD}$, which conditions the output signal at the node to a logic "1". Thus, in the inactive state, the circuit of FIG. 3A performs the NOR function in that it inverts the disjunction of the inputs, which are all at a "zero" logic level.

Next, assume that any one of the input logic signals rises to a logic "1" level. When the signal rises, its associated input transistor turns on, pulling down the voltage at the input node N1 to a point between the drain potential $V_{DD}$ and ground and drawing up the potential at input node N2 to a level substantially equal to that of N1. Equalization of the voltages of N1 and N2 turns off the NMOS transistor T6 and T8. However, the drop in voltage level at input node N1 turns on the PMOS transistors T7 and T9, which draws up the potential at translation nodes N3 and N4 to $V_{DD}$. The result is to turn off the transistor T10 and to turn on the transistor T11, and thereby drop the signal voltage at the output node to a CMOS logic level of "zero". Inspection of the circuit of FIG. 3A will show that the output logic level will remain at zero for so long as any one of the input logic levels is at one. Thus, the circuit of FIG. 3A satisfies all of the conditions for NOR operation.

Refer now to FIGS. 3A and 3B together for an understanding of circuit component operations when an input transitions to a positive CMOS logic level. In response to a positive-going input signal, one of the input transistors IT1–IT32 will turn on and conduct, causing current to flow between the input nodes N1 and N2. Initially, the transistors T1–T5 will become active and conduct current until the voltages at the input nodes are substantially equal. The changing input node voltages will turn off translation transistors T6 and T8 while turning on the translation transistors T7 and T9. As stated above, this draws up the translation nodes N3 and N4, turning on the output transistor T11 and turning the output transistor T10 off. Resultantly, the output level is drawn down by transistor T11 toward ground.

Inspection of FIG. 3A will confirm that the transition from the active to the inactive state will result in momentary current flow in transistors T1-T5 until the input node N1 is drawn up to the drain potential and the input node N2 is drawn down to ground. At this point, the circuit elements of FIG. 3A will have the states indicated in the column of FIG. 3B which is labeled INACTIVE.

The operation of the circuit of FIG. 3A is also illustrated by the waveforms of FIG. 7. In FIG. 7, it is assumed, first, that all of the input signals are at a CMOS logic level of "zero". This is illustrated by waveform $IN_i$. In this case, the voltage at node N1 is pulled up to $V_{DD}$, while the voltage at node N2 is at ground. The NOR function is indicated by the logic "1" state of the output signal OUT. When input signal i transitions at 70 to logic level "1", input transistor ITi conducts pulling the voltage at node N1 down and the voltage at N2 up until the voltages at these nodes are substantially equalized at a level $V_I$ positioned between $V_{DD}$ and ground. In FIG. 7, separation is shown between the active voltage levels at node N1 and N2. Those skilled in the art will appreciate that the difference represents the voltage drop across the input transistor ITi if the design leaves it in a conducting state. If the input transistor is maintained in a non-conducting, on state, the active state voltage levels at nodes N1 and N2 will both equal $V_I$. In response to the transition of the node voltages to their active state levels, the OUT waveform transitions to a "zero" logic level. Assuming that only input INi is active, when it transitions at 75 to logic level "zero", the node voltages and output signal transition in response as illustrated.

FIG. 5 illustrates use of an unbalanced, bistable CMOS input circuit identical with that of FIG. 3A, which is operated with input PMOS transistors 10-42 and an output buffer consisting of transistors T26-T31. FIG. 5 operates essentially as a NAND logic circuit. In this regard, for so long as the input logic levels are all "one", the input transistors 10-42 are off. In this state, the unbalanced input circuit draws up the first input node and draws down the second input node. This turns on translation transistors T26 and T28, thereby turning off the output transistor T30 and turning the output transistor T31 on. This draws down the output node and inverts the conjunction of the input logic "ones". When any of the input logic levels drops, its associated input transistor will turn on and conduct, switching the input nodes to substantially equal potentials between the drain potential and ground. This turns off the translation transistors T26 and T28 and turns on transistors T27 and T29, with the result that the output node is drawn up by the transistor T30 turning on and the transistor T31 turning off.

A combination logic circuit which includes the unbalanced, bistable CMOS input circuit of FIGS. 3A and 5 is shown in FIG. 6. The unbalanced input circuit consists of transistors T41-T45 connected as described above for the NOR logic circuit of FIG. 3A and the NAND logic circuit of FIG. 5. The FIG. 6 combination logic circuit essentially looks for any one of a plurality of input signal combinations such as, for example, the conjunction of input signals IN1 and IN2 or the conjunction of input signals IN3 and IN4. With an appropriate output buffer providing signal translation as described above, FIG. 6 can form the basis of an AND-OR-invert (AOI) circuit.

Contemplation of the CMOS logic circuits illustrated in FIGS. 3A, 5, and 6 will lead to the conclusion that the unbalanced, bistable CMOS input circuit can, when combined with an appropriate output buffer, accept a plurality of input logic signals, and combine those signals according to a CMOS logic function in a single circuit framework. Therefore, the invention permits the construction of single element, multiple input circuits in CMOS technology which can significantly reduce the count of circuit elements in the actual area occupied by the logic circuit for a very high number of inputs.

This advantage is enjoyed without sacrificing speed of circuit operation. In fact, the disclosed CMOS logic circuit design permits selective adjustment of output signal characteristics. If a circuit critical path includes the output leading edge of one of the circuits disclosed and discussed above, an increase in the size of the input transistors will accelerate the voltage equalization between the input nodes, with a concomitant increase in the rise or fall time of the leading edge. If the trailing edge of the output signal is important, the size of the input transistors should be reduced. The disclosed invention also contemplates the use of differently-sized input transistors. Relatedly, since output trailing edge response time depends upon the total capacitance of the input nodes, if only one input transistor is reduced in size, trailing edge response time may not improve. On the other hand, if all input transistors have been increased in size, the output signal will evidence an improvement in leading edge response and a slowing of the trailing edge. Both leading and trailing edge response times can be improved by increasing the size of the input circuit transistors, that is, transistors T1-T5 in FIG. 3A. However, the increase in response time will be paid for by an increase in power.

While I have described several preferred embodiments of my invention, it should be understood that modifications and adaptations thereof will occur to persons skilled in the art. Therefore, the protection afforded my invention should only be limited in accordance with the scope of the following claims.

I claim:

1. A multiple input MOS logic circuit, including:
   a complementary MOS output buffer having a first translation connection, a second translation connection, and an output connection and providing at said output connection a MOS logic signal in response to respective first and second level signals at said first and second translation connections, said MOS logic signal having a first state when said first and second level signals are substantially unequal and a second state when said first and second level signals are substantially equal;
   a bistable CMOS input circuit having a first multi-contact connection point coupled to said first translation connection and a second multi-contact connection point coupled to said second translation connection, said bistable CMOS input circuit providing substantially unequal level signals at said first and second multi-contact connection points in response to a first state of conductivity between said first and second multi-contact connection points, and providing substantially equal level signals at said first and second multi-contact connection points in response to a second state of conductivity between said first and second multi-contact connection points; and a plurality of input CMOS transistor circuits, each having a first current conducting terminal connected to said first multi-contact connection point, a second current conduction terminal connected to said second multi-contact connection point, and at least one gate terminal for establishing said first or said second state of conductivity between said first and second current conducting terminals in response to the state of one of a plurality of CMOS signals input to said circuit.

2. The multiple input MOS logic circuit of claim 1, wherein the bistable CMOS input circuit includes:

a first CMOS load transistor with a drain for connection to a drain potential, a source connected to the first multi-contact node, and a gate connected to the second multi-contact node;

a first CMOS driver transistor with a drain connected to the first multi-contact node, a source for connection to a source potential, and a gate connected to the second multi-contact node;

a second CMOS load transistor with a drain for connection to said drain potential, a source connected to the second multi-contact node, and a gate connected to the first multi-contact node; and a second CMOS driver transistor with a drain connected to the second multi-contact node, a source for connection to a source potential, and a gate connected to the first multi-contact node;

and, wherein the gate of the first CMOS load transistor is wider than the gate of the second CMOS load transistor; and the gate of the second CMOS driver transistor is wider than the gate of the first CMOS driver transistor.

3. The multiple input MOS logic circuit of claim 1, wherein the first state of conductivity is established by all of the input CMOS transistors being off.

4. The multiple input MOS logic circuit of claim 3, wherein the second state of conductivity is established by any of the input CMOS transistors being on.

5. A CMOS logic circuit, comprising:

first and second multi-contact nodes;

a plurality of CMOS input transistors connected in parallel between the first and second multi-contact nodes, each of the CMOS input transistors having a gate for switching the transistor to an on state in response to a predetermined CMOS logic signal level;

a unbalanced, bistable CMOS input circuit coupled to the first and second multi-contact nodes, the unbalanced, bistable CMOS input circuit having a quiescent state in which it provides a voltage at the first multi-contact node at a level substantially equal to a CMOS logic high level and a voltage at the second multi-contact node at a level substantially equal to a CMOS logic low level, and said unbalanced, bistable input CMOS circuit responding to the on state of any input transistor by switching to an active state and changing the voltages to substantially equal levels between the CMOS logic high and low levels; and an output buffer coupled to the first and second multi-contact nodes for providing an output signal conditioned to a predetermined CMOS logic level by the voltages at the first and second nodes.

6. The CMOS logic circuit of claim 5, wherein the unbalanced, bistable CMOS input circuit includes:

a first CMOS load transistor with a drain for connection to a drain potential, a source connected to the first multi-contact node, and a gate connected to the second multi-contact node;

a first CMOS driver transistor with a drain connected to the first multi-contact node, a source for connection to a source potential, and a gate connected to the second multi-contact node;

a second CMOS load transistor with a drain for connection to said drain potential, a source connected to the second multi-contact node, and a gate connected to the first multi-contact node; and a second CMOS driver transistor with a drain connected to the second multi-contact node, a source for connection to a source potential, and a gate connected to the first multi-contact node;

and, wherein the gate of the first CMOS load transistor is wider than the gate of the second CMOS load transistor; and the gate of the second CMOS driver transistor is wider than the gate of the first CMOS driver transistor.

7. A CMOS logic circuit, comprising:

a plurality of substantially identical input CMOS transistors, each including drain and source connections and a gate connection for receiving a respective one of a plurality of input logic signals;

a first node connected to the drain of each input transistor and a second node connected to the source of each input transistor;

a CMOS input circuit including a first CMOS load transistor with a drain for connection to a drain potential, a source connected to the first node and a gate connected to the second node, a first CMOS drive transistor with a drain connected to the first node, a source for connection to a source potential, and a gate connected to the second node, a second CMOS load transistor with a drain for connection to the drain potential, a source connected to the second node, and a gate connected to the first node, and a second CMOS driver transistor with a drain connected to the second node, a source for connection to the source potential, and a gate connected to the first node, wherein the gate of the first CMOS load transistor is wider than the gate of the second CMOS load transistor and the gate of the second CMOS driver transistor is wider than the gate of the first CMOS driver transistor; and a complementary MOS output buffer with a first translation connection coupled to the first node, a second translation connection coupled to the second node, and an output connection, the output buffer providing at said output connection a MOS logic signal in response to respective first and second level signals at the first and second nodes, the logic signal having a first state when the first and second level signals are substantially unequal and a second state when the first and second level signals are substantially equal.

* * * * *